US005770822A

United States Patent [19]
Abolitz et al.

[11] Patent Number: 5,770,822
[45] Date of Patent: Jun. 23, 1998

[54] BULKHEAD GASKET ASSEMBLY

[75] Inventors: Sarah Abolitz, San Francisco; Michael Alan Koken, Sunnyvale, both of Calif.

[73] Assignee: Silicon Graphics, Inc., Mountain View, Calif.

[21] Appl. No.: 697,073

[22] Filed: Aug. 19, 1996

[51] Int. Cl.$^6$ ..................................................... H05K 9/00
[52] U.S. Cl. .................................... 174/35 GC; 361/818; 361/800; 174/35 R
[58] Field of Search ............................ 174/35 R, 35 GC; 361/799, 800, 752, 753, 816, 818; 220/304, 310.1, 681, 690, 691; 439/609, 271, 272, 273, 927, 95

[56] References Cited

U.S. PATENT DOCUMENTS

| | | |
|---|---|---|
| 5,233,507 | 8/1993 | Gunther et al. .......................... 361/818 |
| 5,317,105 | 5/1994 | Weber ................................. 174/35 GC |
| 5,513,996 | 5/1996 | Annerino et al. .......................... 439/95 |

*Primary Examiner*—Bot L. Ledynh
*Assistant Examiner*—Hung V. Ngo
*Attorney, Agent, or Firm*—Wagner, Murabito & Hao

[57] ABSTRACT

An EMI bulk head gasket assembly includes a bulk head and a gasket adapted to snap fit together. The bulk head includes a base plate and first and second bulk head side walls, positioned at right angles to the bulk head base plate. The first bulk head side wall includes a plurality of bulk head apertures. The gasket includes a base plate and first and second gasket side walls wherein the first gasket side wall forms an angle slightly greater than ninety degrees with the gasket base plate. The gasket is adapted to snap fit between the first and second bulk head side walls. The first gasket side wall includes inwardly pointing tabs positioned and adapted to fit into the plurality of bulk head apertures. The tabs retain the gasket between the first and second bulk head side walls. The gasket includes spring fingers each of which include a spring bend between a proximal spring finger section and a distal spring finger section. The spring finger is spring loaded by the spring bend. An inner fold over bend in the distal spring finger section has a fold over angle of 180 degrees to round the distal edge of the distal spring finger section and also to provide rigidity to the distal spring finger section. The gasket base plate includes through holes lining up with through holes in the bulk head base plate when the gasket is snap fitted with the bulk head. The dimensions of the gasket base plate and bulk head base plate can be varied to fit variably sized ports.

13 Claims, 12 Drawing Sheets

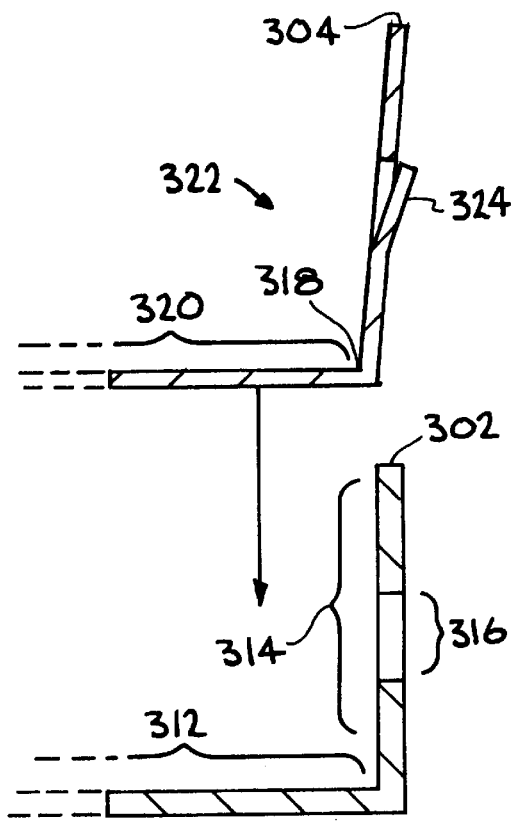
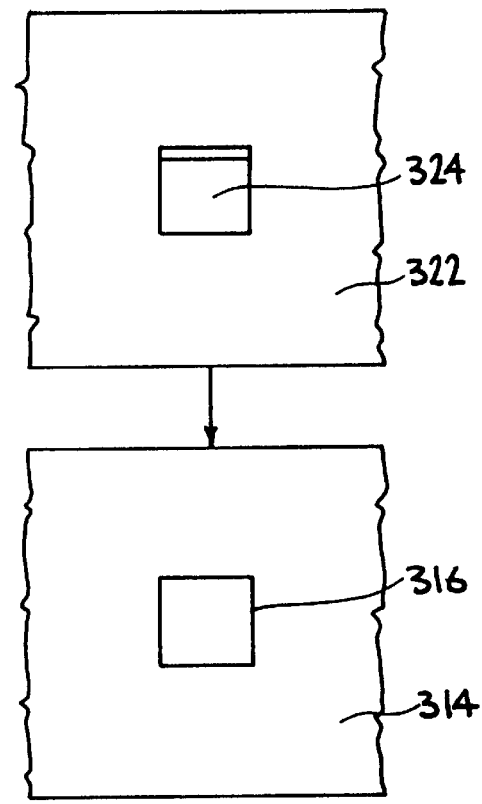
FIG. 5A
FIG. 5C
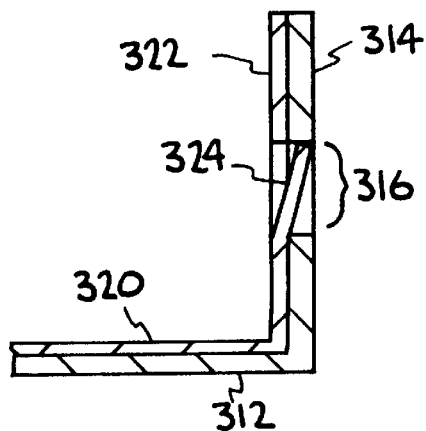
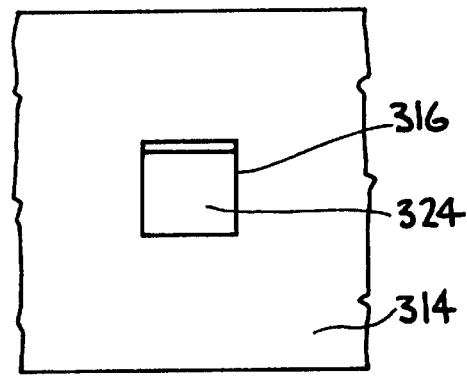
FIG. 5B
FIG. 5D

BULKHEAD GASKET ASSEMBLY

BACKGROUND OF THE INVENTION

1. Field of the Invention

The present invention pertains to the field of electromagnetic compatibility. Specifically, the present invention pertains to bulk head gasket assemblies.

2. Background Technology

Electromagnetic interference (EMI) is a measure of electromagnetic radiation from equipment. Electromagnetic compatibility (EMC) is a measure of equipment tolerance to external electromagnetic fields such as EMI from other external equipment. EMC and EMI are increasingly important design considerations for almost all electronics equipment. Strict EMI/EMC standards have been set in many industries including the computer industry.

Shielding enclosures, such as a computer chassis, protect internal electronic equipment from exterior electric or magnetic fields thereby improving EMC performance of the enclosed equipment. Shielding enclosures also protect the surrounding environment from the effects of an interior electric or magnetic field. Shielding enclosures are generally constructed from metal with provisions for continuous electrical contact between adjoining panels. EMI gaskets are commonly positioned between contact surfaces of parts requiring a sealed joint.

With reference to Prior Art FIG. 1A, a computer chassis 100 is shown. Computer chassis 100 includes a panel 102 having a card drive port 104 through which a plurality of printed circuit boards (PCBs) can be inserted in parallel.

Referring now to Prior Art FIG. 1B, computer chassis 100 is shown with a pair of parallel PCBs 106, 108 partly inserted through card drive port 104. Without shielding over card drive port 104, EMI from the interior of computer chassis 100 can radiate out from card drive port 104 between and around PCBs 106 and 108. In the prior art, EMI bulk head gasket assemblies are affixed between PCBs and a computer chassis to prevent EMI from radiating out of the chassis.

Referring to Prior Art FIG. 1C, a diagram is shown of PCB 106 affixed to a prior art bulk head 110. Prior art bulk head 110 provides rigidity for PC board 106 and serves as an EMI shield for preventing EMI from the interior of chassis 100 from radiating out from card drive port 104 between and around PCBs 106 and 108 (Prior Art FIG. 1B).

With reference to Prior Art FIG. 1D, a diagram is shown of PCBs 106 and 108 affixed to prior art bulk heads 110 and 112. PCBs 106 and 108 are shown positioned partly inserted into card drive port 104.

Referring to Prior Art FIG. 1E, a diagram is shown of prior art bulk head 110 fully inserted into a slot in card drive port 104. Prior art bulk head 110 is parallel and adjacent to prior art bulk head 112. Prior art bulk head 112 is shown partially inserted into card drive port 104. Without an EMI gasket, the space between prior art bulk heads 110 and 112 is without shielding and EMI from the interior of chassis 100 can radiate out of card drive port 104 between and around bulk heads 110 and 112. An EMI gasket, properly positioned between prior art bulk heads 110 and 112 and the perimeter of card drive port 104, provides shielding to prevent EMI from radiating out of the interior of chassis 100. Card drive port 104 comprises an area large enough to insert five bulk head gasket assemblies. Prior art bulk heads 110 and 112 are shown inserted in card drive port 104 in first and second PCB slots 114 and 116 respectively. Three additional PCB slots 118, 120, 122 can each receive a bulk head gasket assembly or can be provided with baffle covers. Baffle covers are used to shield empty PCB slots which are not being used. A baffle cover includes a shielding plate having an area and shape identical to the rear plate of bulk head 110. Baffle covers provide shielding to prevent EMI from radiating out, through unused PCB slots, from the interior of chassis 100.

With reference now to Prior Art FIG. 2A, a perspective view is shown of a prior art bulk head gasket assembly 200. Prior art bulk head gasket assembly 200 includes a bulk head 202 and a plurality of prior art spring fingers 204 for preventing EMI from radiating out of the interior of chassis 100 of Prior Art FIG. 1. Prior art spring fingers 204 are designed to make electrical contact with a shielding enclosure at the perimeter of an opening in the shielding enclosure, such as card drive port 104 of computer chassis 100. Prior art spring fingers 204 are spring loaded when prior art bulk head gasket assembly 200 is inserted into an opening in a shielding enclosure such as card drive port 104 in computer chassis 100.

One problem associated with the manufacturing of prior art bulk head gasket assembly 200 is that prior art spring fingers 204 must be affixed to bulk head 202 by screws, rivets, or some other type of complicated fastening means. The process of attaching prior art spring fingers 204 to bulk head 202 is expensive, difficult, and time consuming.

Another problem associated with the use of prior art bulk head gasket assembly 200 is that prior art spring fingers 204 are prone to bending and/or deformation during installation into an opening in a shielding enclosure, such as card drive port 104 in computer chassis 100. Prior art spring fingers 204 are also prone to bending and/or deformation during shipping and handling. When deformed, prior art spring fingers 204 can fail to make electrical contact with the periphery of an opening in a shielded enclosure. Additionally, deformed prior art spring fingers 204 can impede installation of bulk head gasket assembly 200 into a corresponding slot in a shielded enclosure.

With reference now to Prior Art FIG. 2B, a perspective view is shown of prior art bulk head gasket assembly 200 with an inwardly bent prior art spring finger 208 and an outwardly bent prior art spring finger 210. For purposes of the present invention, spring fingers which are "bent" or "deformed" refer to spring fingers which are perpetually, not resiliently, bent out of shape. The inward bend of prior art spring finger 208 can result in failure of prior art spring finger 208 to make electrical contact with an adjacent surface. The adjacent surface can include the periphery of a port in a shielding enclosure or another adjacent bulk head gasket assembly. Failure of prior art spring finger 208 to make electrical contact with an adjacent surface can result in EMI passing through the junction between spring finger 208 and an adjacent surface. The outward bend of spring finger 210 can obstruct installation of spring finger 210 into a slot as is discussed below.

Referring to Prior Art FIG. 2C, a top view is shown of prior art bulk head gasket assembly 200 being inserted into an opening in a shielding enclosure between two other prior art bulk head gasket assemblies 212 and 214. An outwardly bent spring finger 210, of prior art bulk head gasket assembly 200, is shown contacting the rear end of bulk head gasket assembly 214. As prior art bulk head gasket assembly 200 is inserted between bulk head gasket assemblies 212 and 214, outwardly bent spring finger 210 obstructs the path of insertion of prior art bulk head gasket assembly 200. Thus, it is desirable in bulk head gasket assemblies to have spring fingers which are not prone to outward bending so that the path of insertion of the bulk head gasket assembly is not obstructed.

With reference to Prior Art FIG. 2D, a top view is shown of prior art bulk head gasket assembly 200 fully inserted into an opening in a shielding enclosure between prior art bulk head gasket assemblies 212 and 214. Inwardly bent spring finger 208, as shown in Prior Art FIG. 2D, fails to make electrical contact with an adjacent prior art spring finger 216 of prior art bulk head gasket assembly 214. Failure of electrical contact between prior art spring fingers of adjacent bulk head gasket assemblies results in degraded EMI shielding performance of the two adjacent bulk head gasket assemblies.

With reference again to Prior Art FIG. 2A, yet another problem associated with prior art bulk head gasket assembly 200 is that prior art spring fingers 204 have sharp edges which create a human safety hazard for users during installation and rework of prior art spring fingers 204. Manual handling of prior art bulk head gasket assembly 200 poses an increased safety risk when one or more of prior art spring fingers 204 are bent.

Thus, a need exists for a bulk head gasket assembly wherein the gasket can be easily mated with the bulk head without requiring screws, rivets, or other types of complicated fastening means. A further need exists for a gasket having spring fingers which are not prone to perpetual deformation during ordinary shipping, handling, and installation. Yet another need exists for a gasket without sharp edges which are prone to cause a safety hazard during handling of the gasket.

SUMMARY OF THE INVENTION

A bulk head gasket assembly (BGA) according to the present invention is adapted to provide EMI shielding at a port in a shielding enclosure. One embodiment of the BGA of the present invention is adapted to provide EMI shielding at an interface between a printed circuit board (PCB) and a card drive port in a panel of a computer chassis.

The BGA of the present invention includes a bulk head and a gasket each adapted to snap fit together without requiring adhesives, rivets, screws, or other attachment means. The bulk head of the present invention includes a bulk head base plate and first and second bulk head side walls, positioned at right angles to the bulk head base plate at opposite edges of the bulk head base plate. The first and second bulk head side walls form a recess in the bulk head. The first bulk head side wall includes a plurality of bulk head apertures.

The gasket of the present BGA includes a gasket base plate and first and second gasket side walls positioned at opposite edges of the gasket base plate wherein the first gasket side wall forms an angle slightly greater than ninety degrees with the gasket base plate. The gasket is adapted to snap fit between the first and second bulk head side walls. To mate the gasket with the bulk head, the gasket is inserted base plate first into the recess in the bulk head. The gasket mates with the bulk head when the gasket base plate contacts the bulk head base plate. The first gasket side wall includes a plurality of inwardly pointing tabs positioned and adapted to snap fit into the plurality of bulk head apertures in the first bulk head side wall when the gasket is fully inserted into the recess in the bulk head. The first gasket side wall, which forms an angle slightly greater than ninety degrees with the gasket base plate, is spring loaded against the first bulk head side wall when the gasket is inserted in the recess between the first and second bulk head side walls. The plurality of tabs, positioned and adapted to snap fit with the plurality of bulk head apertures, retains the gasket between the first and second bulk head side walls.

The gasket includes spring fingers integral with the second gasket side wall and extending outward from a distal edge of the second gasket side wall. Each of the spring fingers includes a spring bend between a proximal spring finger section and a distal spring finger section. The spring finger is spring loaded by the spring bend. The spring finger is designed to provide a spring loaded force to a surface positioned adjacent to the spring finger. An adjacent surface can include another identical gasket or can include the periphery of a port in a shielding enclosure. Varying the adjustment angle of the third and fourth gasket bends varies the total width of the gasket and also varies the spring loaded force delivered by the spring fingers to an adjacent surface.

An inner fold over bend in the distal spring finger section has a fold over angle of 180 degrees to round the distal edge of the distal spring finger section and also to provide rigidity to the distal spring finger section. Rounding the distal edge of the distal spring finger section ensures that the distal edge of the distal spring finger section will not injure a user of the gasket during installation or rework. Rounding the distal edge of the distal spring finger section also helps to ensure that the distal edge of the distal spring finger section will not obstruct insertion of a second BGA into a position adjacent to the spring fingers of the BGA.

The gasket base plate includes through holes lining up with through holes in the bulk head base plate when the gasket is snap fitted with the bulk head. The corresponding aligned through holes provide access to the interior of the shielding enclosure when the bulk head gasket assembly is installed over the port in the shielding enclosure. In an embodiment of the present invention, the corresponding aligned through holes provide access to the PCB and other circuitry inside the computer chassis when the BGA of the present invention is installed over the card drive port in the computer chassis.

In the present invention, the dimensions of the gasket base plate and bulk head base plate can be varied to fit variably sized ports. In the present invention, the dimensions of the gasket base plate and bulk head base plate can also be varied to accommodate variably sized PCBs.

These and other objects and advantages of the present invention will no doubt become obvious to those of ordinary skill in the art after having read the following detailed description of the preferred embodiments which are illustrated in the various drawing FIGS.

BRIEF DESCRIPTION OF THE DRAWINGS

The present invention is illustrated by way of example, and not by way of limitation, in the FIGS of the accompanying drawings and in which like reference numerals refer to similar elements and in which:

Prior Art

Prior Art

Prior Art

Prior Art

Prior Art

Prior Art

Prior Art

Prior Art

Prior Art

FIG. 5A is a top view diagram illustrating the path of insertion of a gasket tab 324 into a corresponding bulk head aperture 316.

FIG. 5B is a top view of gasket tab 324 mated by snap fit with bulk head aperture 316.

FIG. 5C is a side view of the path of insertion of gasket tab 324 into bulk head aperture 316.

FIG. 5D is a side view of gasket tab 324 mated by snap fit with bulk head aperture 316.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
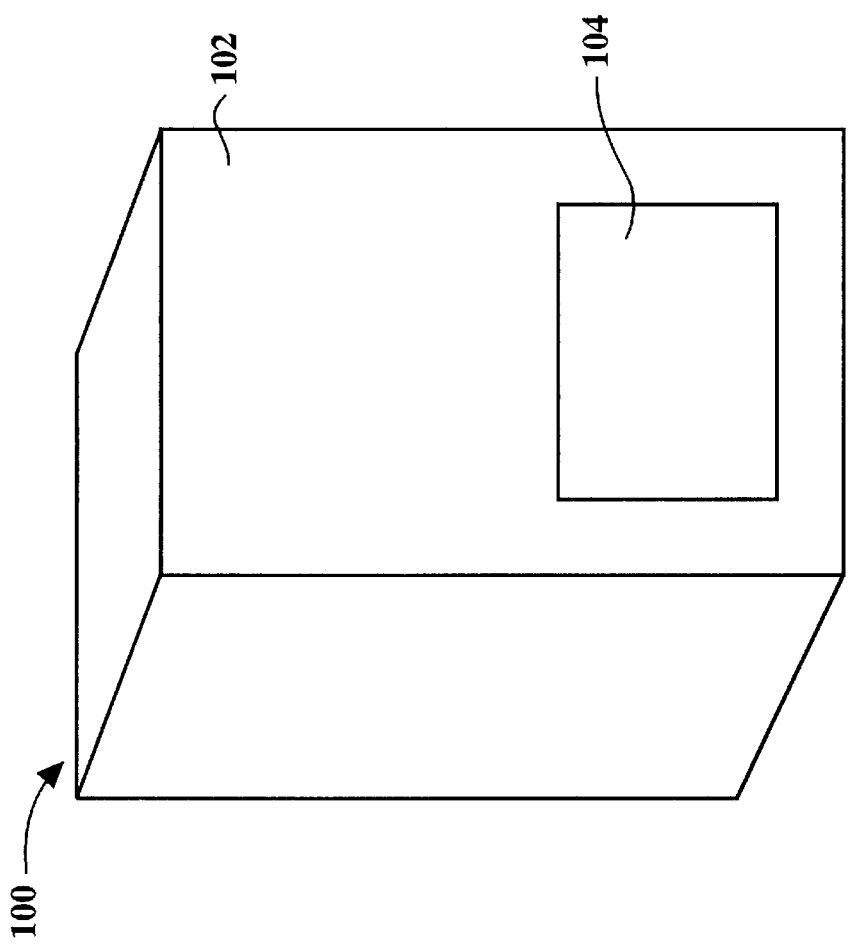
FIG. 1A shows a perspective view of a computer chassis 100 including a panel having a card drive port 104.
Figure 1B:
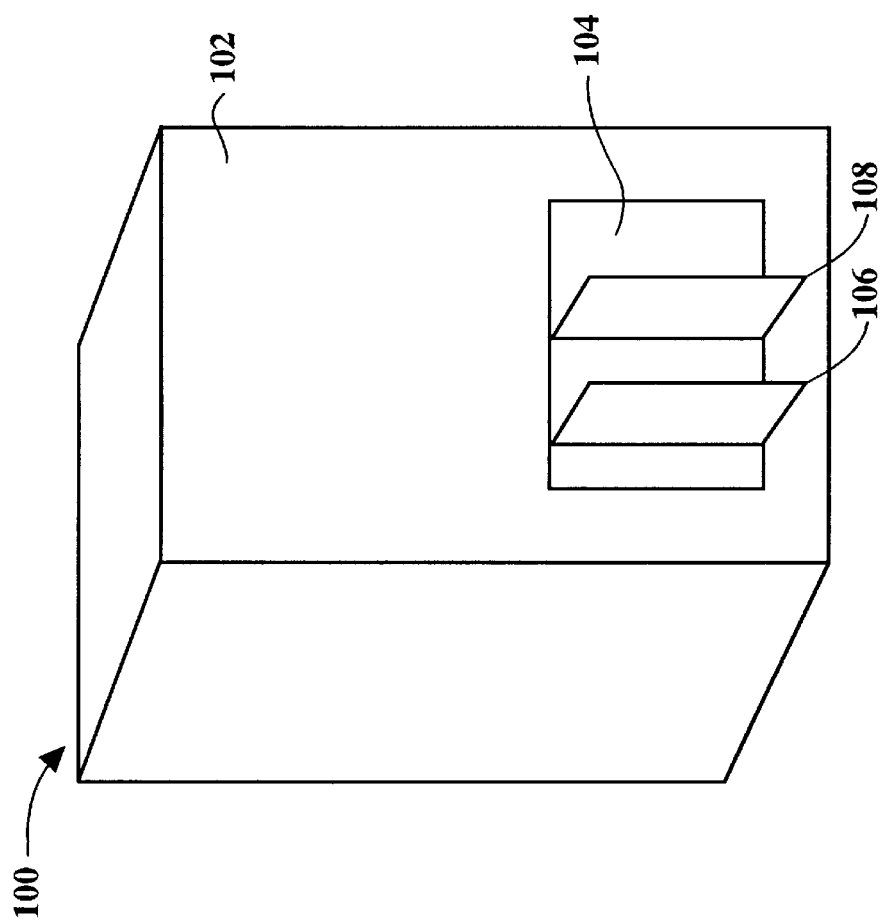
FIG. 1B shows a perspective view of computer chassis 100 with a pair of printed circuit boards (PCBs) partly inserted, in parallel, into card drive port 104.
Figure 1C:
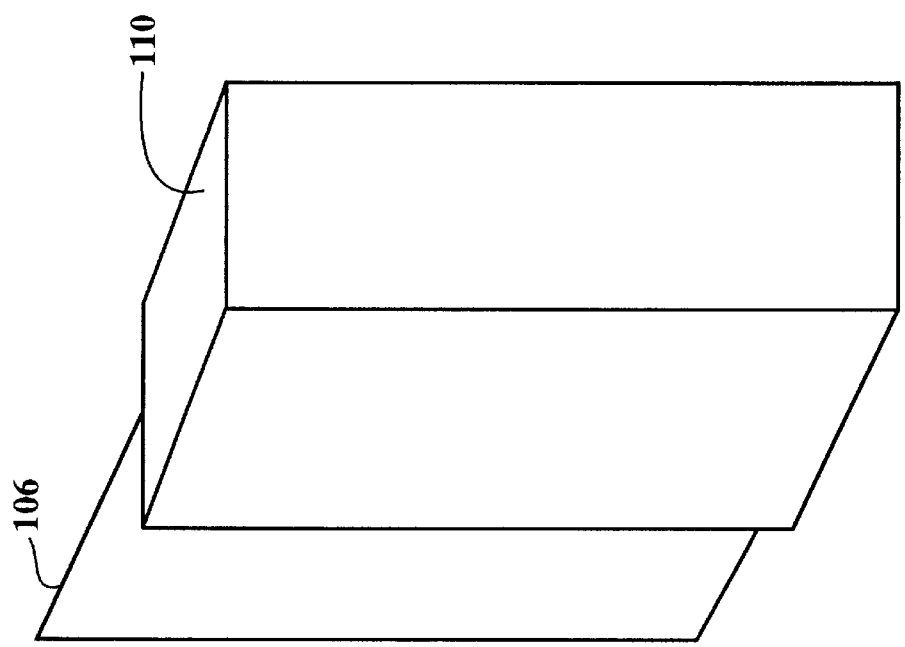
FIG. 1C shows a perspective view of a PCB affixed to a prior art bulk head.
Figure 1D:
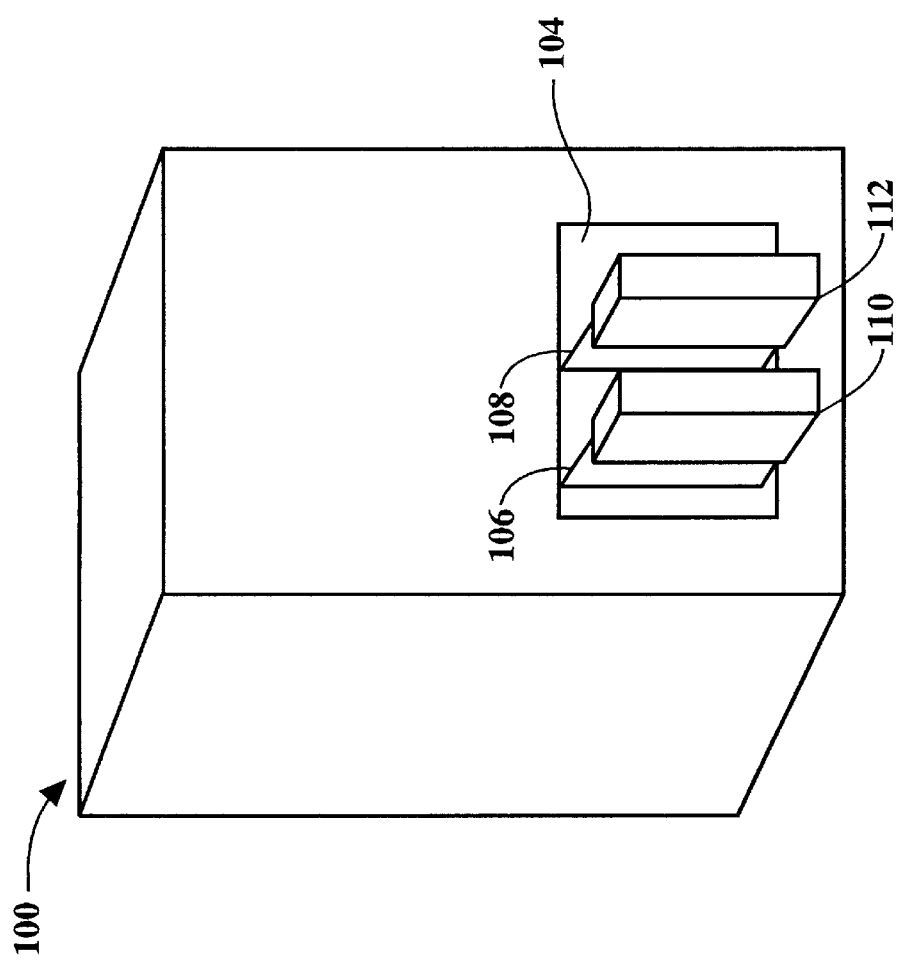
FIG. 1D shows a perspective view of a pair of prior art bulk head gasket assemblies partially inserted in parallel into card drive port 104 of chassis 100.
Figure 1E:
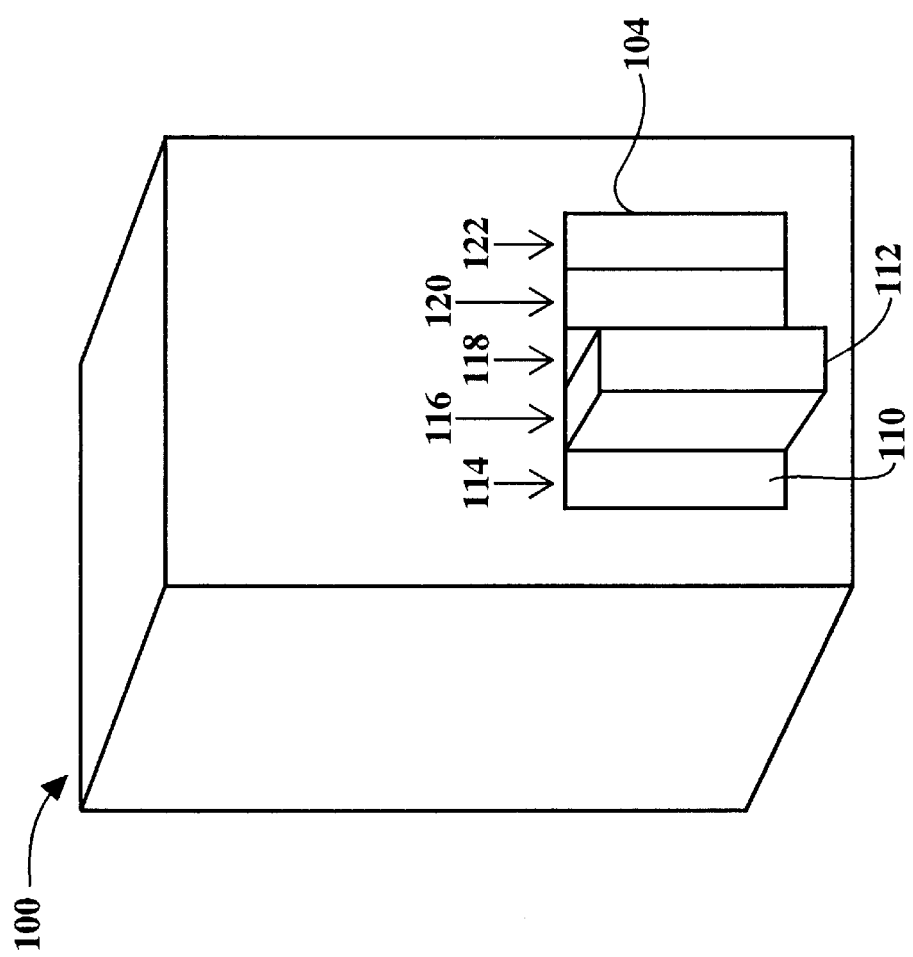
FIG. 1E shows a perspective view of a prior art bulk head gasket assembly 110 fully inserted into a slot in card drive port 104 of chassis 100.
Figures 2A, 2B:
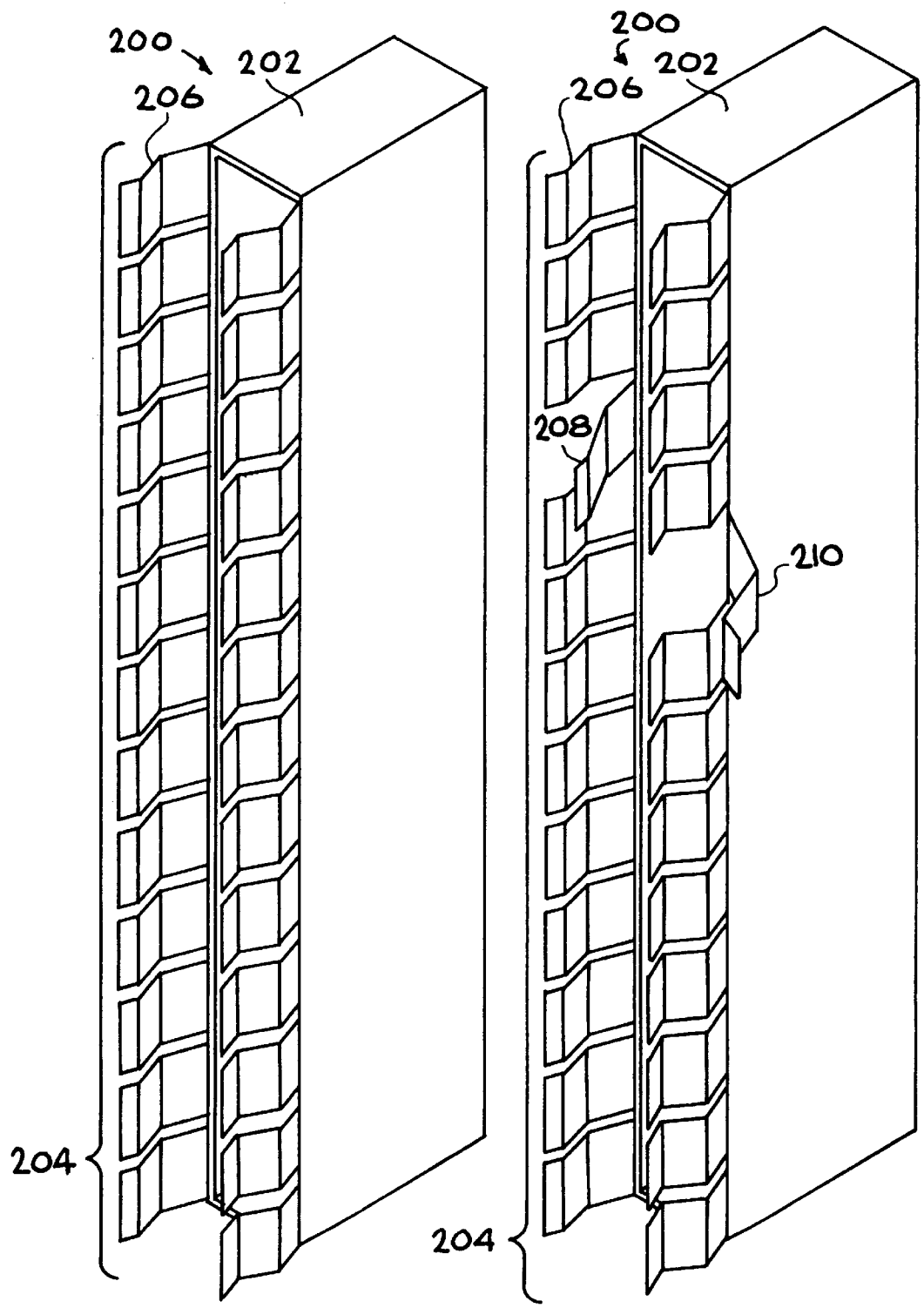
FIG. 2A is a perspective view of a prior art bulk head gasket assembly 200.
FIG. 2B is a perspective view of a prior art bulk head gasket assembly 200 with bent spring fingers.
Figure 2C:
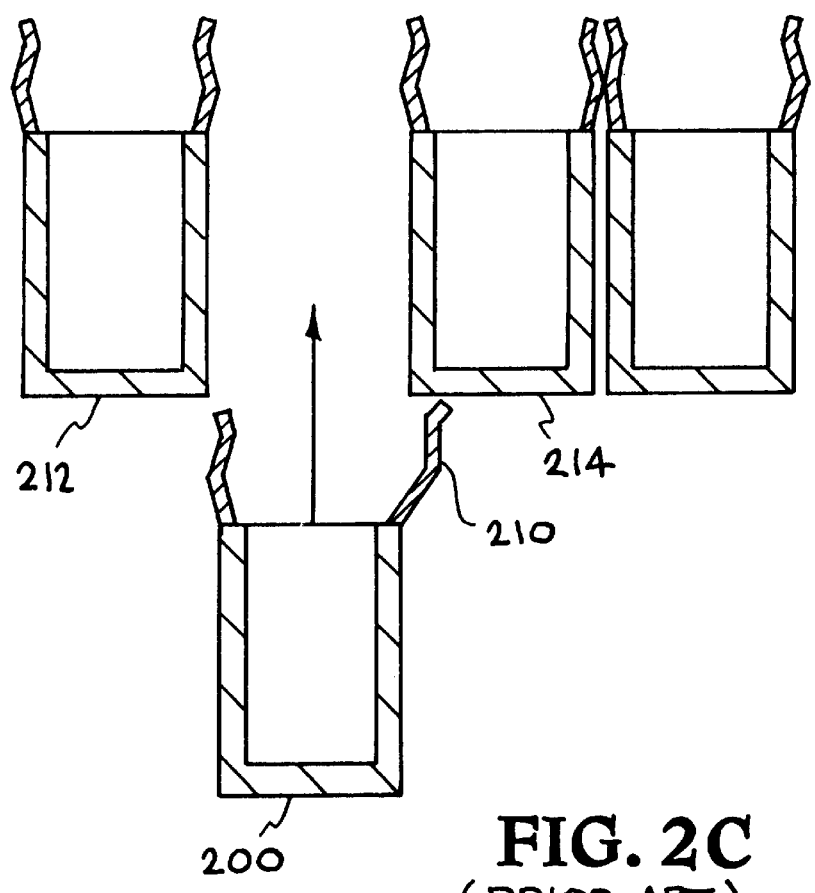
FIG. 2C is a top view of prior art bulk head gasket assembly 200 being inserted into a slot in card drive port 104 of chassis 100 between two other identical prior art bulk head gasket assemblies.
Figure 2D:
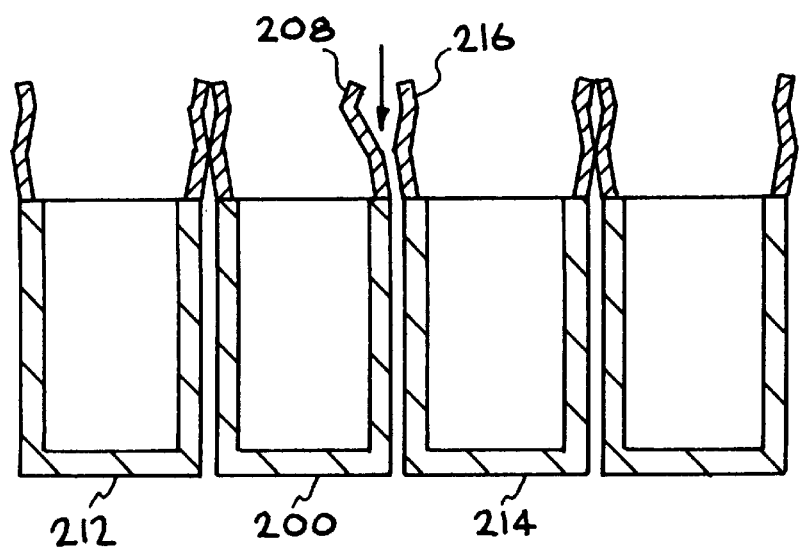
FIG. 2D is a top view of prior art bulk head gasket assembly 200 fully inserted into a slot in card drive port 104 of chassis 100.
Figures 3A, 3B:
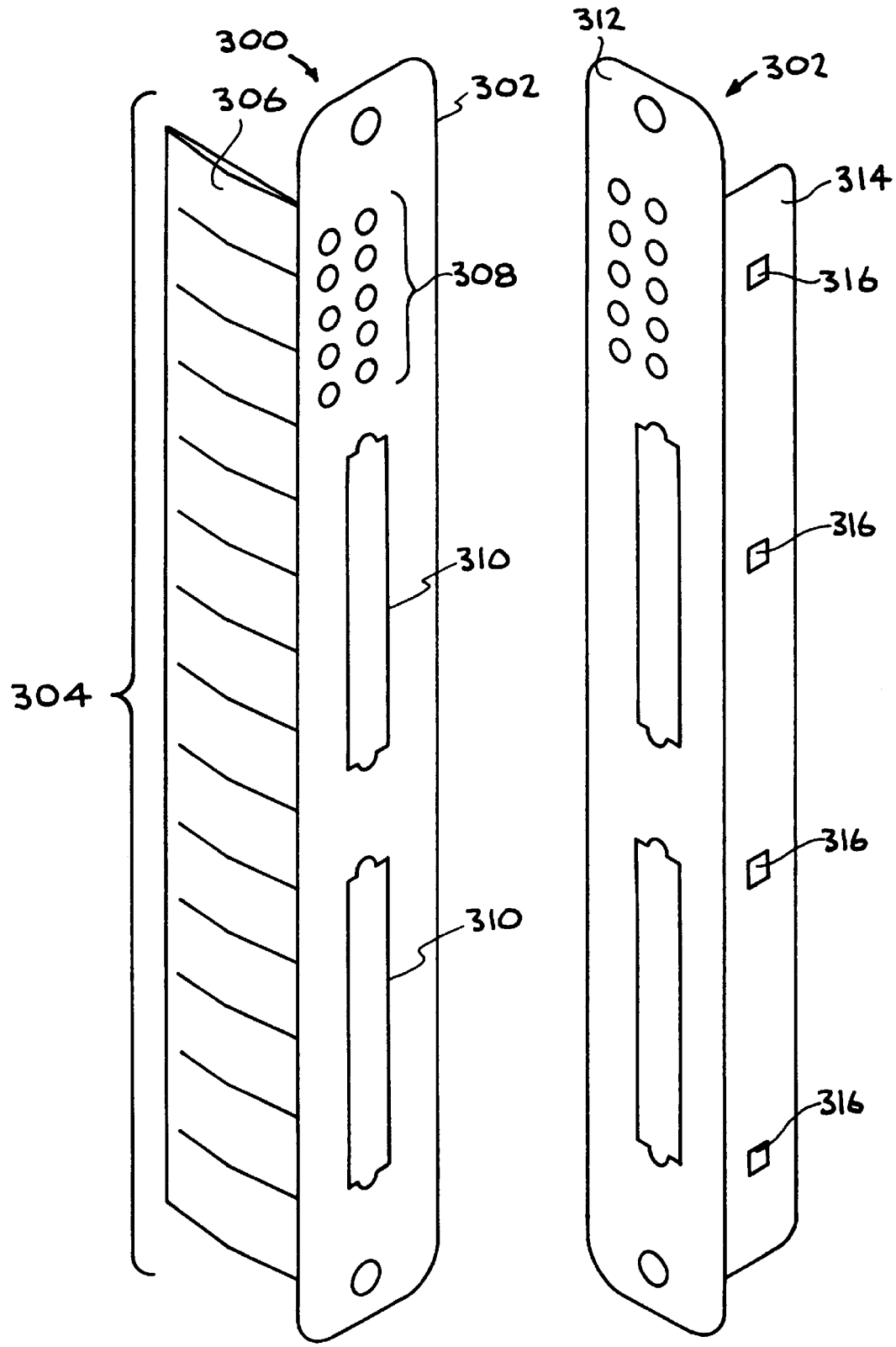
FIG. 3A is a first perspective view of a bulk head gasket assembly 300 according to the present invention.
FIG. 3B is a second perspective view of bulk head gasket assembly 300 according to the present invention.

With reference to FIG. 3A, a first perspective view is shown of a bulk head gasket assembly (BGA) 300 according to the present invention. BGA 300 is adapted to provide shielding at a port in a shielding enclosure such as a card drive port in a computer chassis. BGA 300 is adapted to couple with a printed circuit board (PCB) for insertion into the shielding enclosure. BGA 300 includes a bulk head 302 and a gasket 304 each adapted to snap fit together r without requiring any additional fastening means such a rivet, screw, or adhesive. Gasket 304 includes a plurality of spring fingers, an example of which is spring finger 306. Bulk head 302 and gasket 304 are fabricated with conductive materials to provide EMI shielding. Bulk head 302 and gasket 304 both include corresponding through holes 308 and 310 which line up respectively with each other for throughput connections to circuitry within the shielding enclosure such as a PCB (not shown). The width and height of bulk head 302 can be varied to fit varying sized slots in varying sized ports. In the present invention, the width and height of bulk head 302 can also be varied to accommodate varying sized printed circuit boards.

Referring to FIG. 3B, a second perspective view is shown of bulk head 302 which includes a bulk head base plate 312 and a first bulk head side wall 314. Bulk head base plate 312 is designed to fit over a port in a panel of a shielding enclosure. First bulk head side wall 314 includes apertures 316 for snap fit engagement with tabs on gasket 304 of FIG. 3A.

Figure 4A:
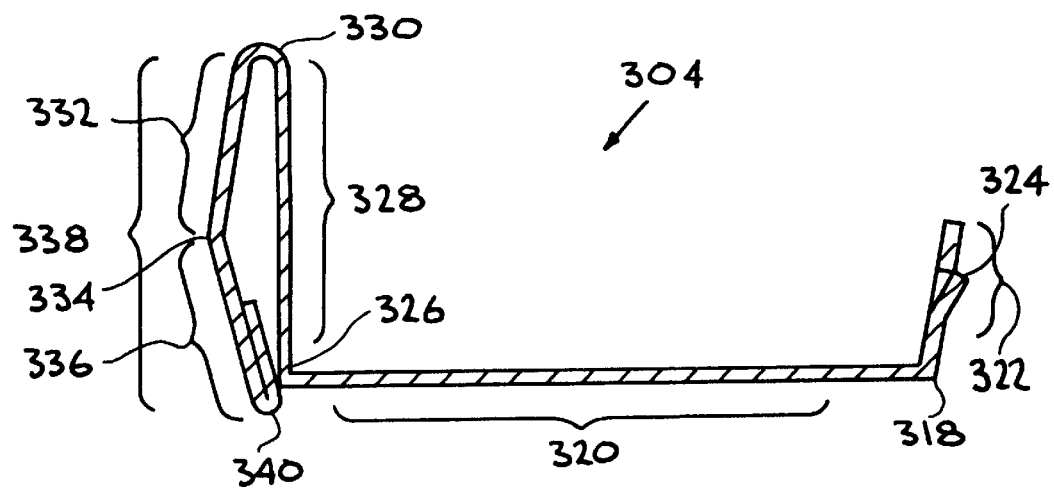
FIG. 4A is a top view of a gasket 304 according to the present invention.
Figure 4B:
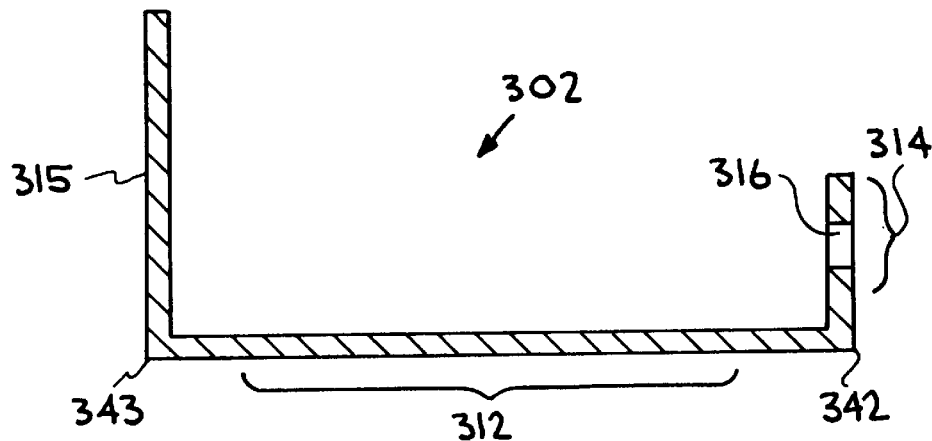
FIG. 4B is a top view of a bulk head 302 according to the present invention.

With reference now to FIGS. 4A and 4B, top views are shown respectively of gasket 304 and bulk head 302 of BGA 300 all of FIG. 3A. Gasket 304 is designed to snap fit to bulk head 302. Bulk head 302 includes a bulk head base plate 312 and first and second bulk head side walls 314, 315. Gasket 304 includes a gasket base plate 320 and first and second gasket side walls 322, 328.

Referring to FIG. 4A, a first gasket bend 318 forms an angle slightly greater than 90 degrees between gasket base plate 320 and first gasket side wall 322. First gasket side wall 322 includes a tab 324 for mating gasket 304 with bulk head 302. The area of gasket base plate 320 can be varied to accommodate variably sized PCBs and shielding enclosure ports. A second gasket bend 326 forms an angle between gasket plate 320 and a second gasket side wall 328. A third gasket bend 330 forms an angle slightly less than 360 degrees between second gasket side wall 328 and a proximal spring finger section 332. A fourth gasket bend 334 forms an adjustment angle between proximal spring finger section 332 and a distal spring finger section 336. Proximal and distal spring finger sections 332, 336 form a spring finger 338 which is spring loaded by fourth gasket bend 334 and also by third gasket bend 330. Spring finger 338 is designed to provide a spring loaded force to a surface positioned adjacent spring finger 338 of gasket 304. An adjacent surface can include another gasket of the type of gasket 304 or can include the periphery of a port in a shielding en closure. Varying the adjustment angle of fourth gasket bend 334, along with the angle of the third gasket bend 330, varies the total width of gasket 304 and also varies the spring loaded force delivered by spring finger 338 to an adjacent surface.

A fifth gasket bend 340 is comprised of an inner fold over bend having an angle of 180 degrees. Fifth gasket bend 340 rounds the distal edge of distal spring finger section 336 and also provides rigidity to distal spring finger section 336.

In one embodiment of the present invention, gasket 304 is fabricated from a sheet 5 mils thick. However, the present invention is well suited to varying this dimension. But, without rounding, the 5 mil thick distal edge of distal spring finger section 336 is sharp enough to create a safety hazard. By rounding the distal edge of distal spring finger section 336, the distal edge is made blunt instead of sharp. Rounding the distal edge of distal spring finger section 336 ensures that the distal edge of distal spring finger section 336 will not injure a user of gasket 304 during installation or rework. Rounding the distal edge of distal spring finger section 336 also helps to ensure that the distal edge of distal spring finger section 336 will not obstruct insertion of another BGA into a position adjacent spring finger 338 of gasket 304 as is explained below.

With reference now to FIG. 4B, a top view of bulk head 302 is shown. A first bulk head bend 342 forms a right angle between first bulk head side wall 314 and bulk head base plate 312. Gasket 304 is designed to snap fit into bulk head 302. First bulk head side wall 314 includes an aperture 316 for receiving tab 324 of first gasket side wall 322 of FIG. 4A. In the present invention, bulk head 302 is fabricated from a sheet which is 48 mils thick. However, the present invention is well suited to varying this dimension.

With reference to FIG. 5A, a top view diagram illustrates the path of insertion of gasket 304 into bulk head 302. FIG. 5A shows a partial top view of gasket 304, including gasket base plate 320 and first gasket side wall 322. FIG. 5A also shows a partial top view of bulk head 302 including bulk head base plate 312 and first bulk head side wall 314. As previously mentioned, first gasket bend 318 forms an angle slightly greater than 90 degrees between gasket base plate 320 and first gasket side wall 322 while first gasket bend 318 is unstressed.

With reference to FIG. 5B, a top view diagram illustrates gasket 304 inserted into bulk head 302. FIG. 5B shows a partial top view of gasket 304 mated with bulk head 302 including the base and first side wall of each. While gasket 304 is inserted into bulk head 302, first gasket bend 318 is stressed and deformed to a ninety degree angle. As first gasket bend 318 is stressed and deformed to a ninety degree angle, first gasket bend 318 becomes spring loaded. The spring loaded gasket bend 318 creates a spring force which locks gasket tab 324 into bulk head aperture 316 for mating gasket 304 with bulk head 302.

Referring to FIG. 5C, a side view is shown of the path of insertion of gasket tab 324 into bulk head aperture 316. With reference to FIG. 5D, a side view is shown of gasket tab 324 inserted into bulk head aperture 316.

Figure 6:
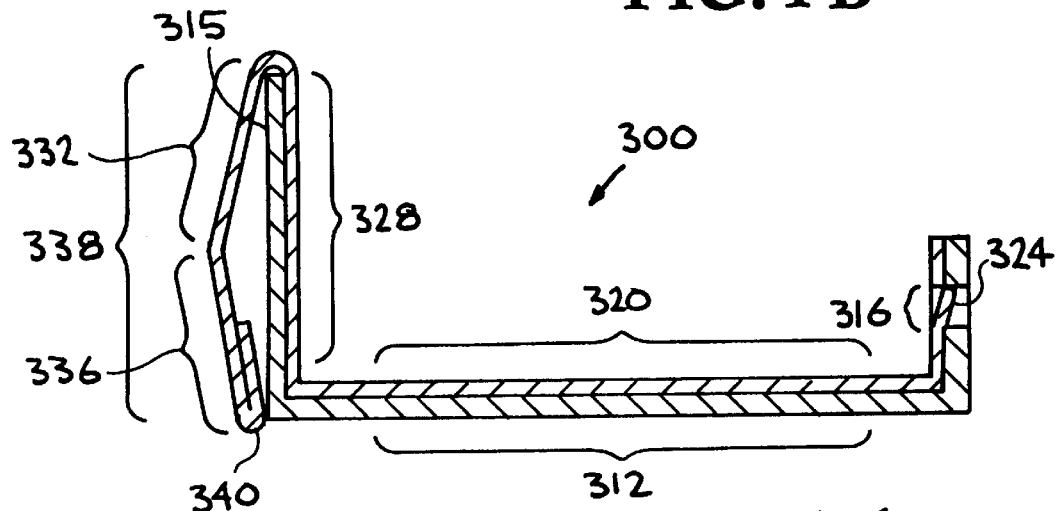
FIG. 6 is a top view of bulk head gasket assembly 300 including gasket 304 mated by snap fit with bulk head 302.

With reference to FIG. 6, a top view is shown of BGA 300 in a snap fit mated position. Gasket tab 324 is shown inserted into bulk head aperture 316. Second gasket side wall 328 and spring finger 338 clip over second bulk head side wall 315 when gasket 304 is inserted between first and second bulk head side walls 314, 315. Spring finger 338 is buttressed by second bulk head side wall 315 which slips between second gasket side wall 328 and spring finger 338. This buttressing of spring finger 338 prevents permanent deformation of spring finger 338 during shipping, handling, installation, and rework. As mentioned, spring finger 338, which is spring loaded by fourth gasket bend 334 and third gasket bend 330, is designed to provide a resilient spring loaded force to a surface positioned adjacent spring finger 338 of gasket 304. The buttressing, provided by first bulk head side wall 315, prevents deformation of spring finger 338 at fourth gasket bend 334 by preventing spring finger 338 from bending too far inward. Varying the adjustment angle of fourth gasket bend 334, along with the angle of third gasket bend 330, varies the total width of gasket 304 and also varies the spring loaded force delivered by spring finger 338 to an adjacent surface. In an embodiment of the present invention, the adjustment angle of fourth gasket bend 334 is set such that the distance between fourth gasket bend 334 and second gasket side wall 328 is 77 mils. However, the present invention is also well suited to varying this dimension.

Figure 7:
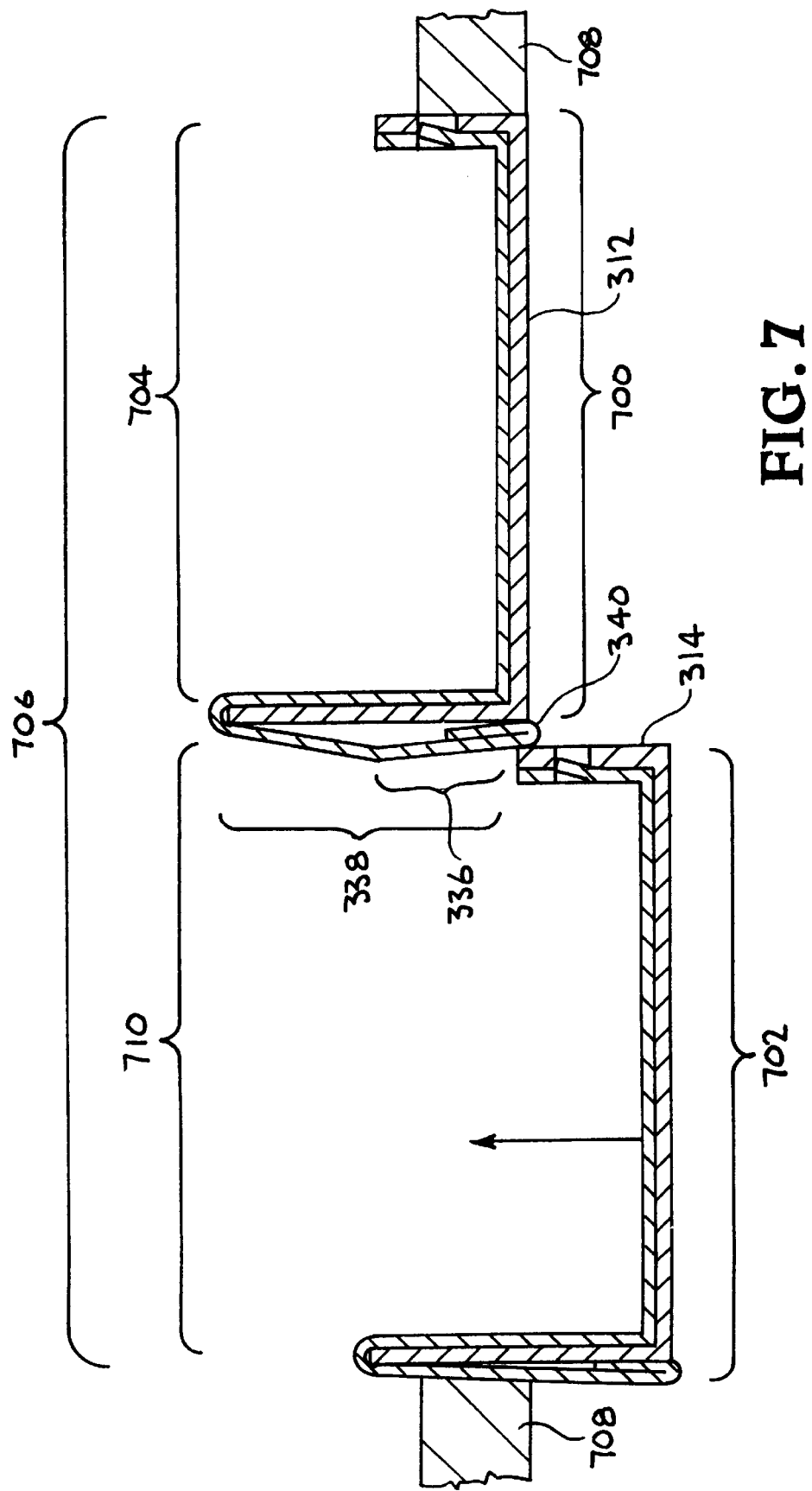
FIG. 7 is a top view of a bulk head gasket assembly according to the present invention being inserted between a panel of a shielding enclosure and another bulk head gasket assembly according to the present invention.

With reference to FIG. 7, a diagram is shown of a pair of BGAs 700 and 702 according to the present invention. Each of BGAs 700 and 702 is identical to BGA 300. BGA 700 is shown fully inserted into a first slot 704 of a port 706 in a shielding enclosure 708. BGA 702 is shown partially inserted into a second slot 710 of port 706. Second slot 710 is parallel and adjacent to first slot 704. As BGA 702 is inserted into slot 710, spring finger 338 of BGA 700 begins to compress. Contact, between spring finger 338 of BGA 700 and first bulk head side wall 314 of BGA 702, allows electrical conduction between spring finger 338 and first bulk head side wall 314. Higher conductivity between spring finger 338 of BGA 700 and first gasket side wall 314 of BGA 702 allows for higher shielding effectiveness at the joint between spring finger 338 of BGA 700 and first gasket side wall 314 of BGA 702. Conductivity between spring finger 338 of BGA 700 and first gasket side wall 314 of BGA 702 is a function of the spring load force asserted by spring finger 338 on first gasket side wall 314.

Distal spring finger section 336 of BGA 700 extends below the plane of bulk head base plate 312 of BGA 700. Distal spring finger section 336 of BGA 700 forms an angle less than ninety degrees with bulk head base plate 312. Fifth gasket bend 340, which is comprised of an inner fold over bend, forms a smooth rounded distal edge of distal spring finger section 336. The above described structural characteristics, of distal spring finger section 336 of BGA 700, facilitate unobstructed insertion of BGA 702 into slot 710 adjacent BGA 700. By facilitating unobstructed insertion of BGA 702 into slot 710 adjacent BGA 700, the structural characteristics of distal spring finger section 336 help to ensure that spring fingers 338 of BGA 700 are not over stressed during installation.

Figure 8:
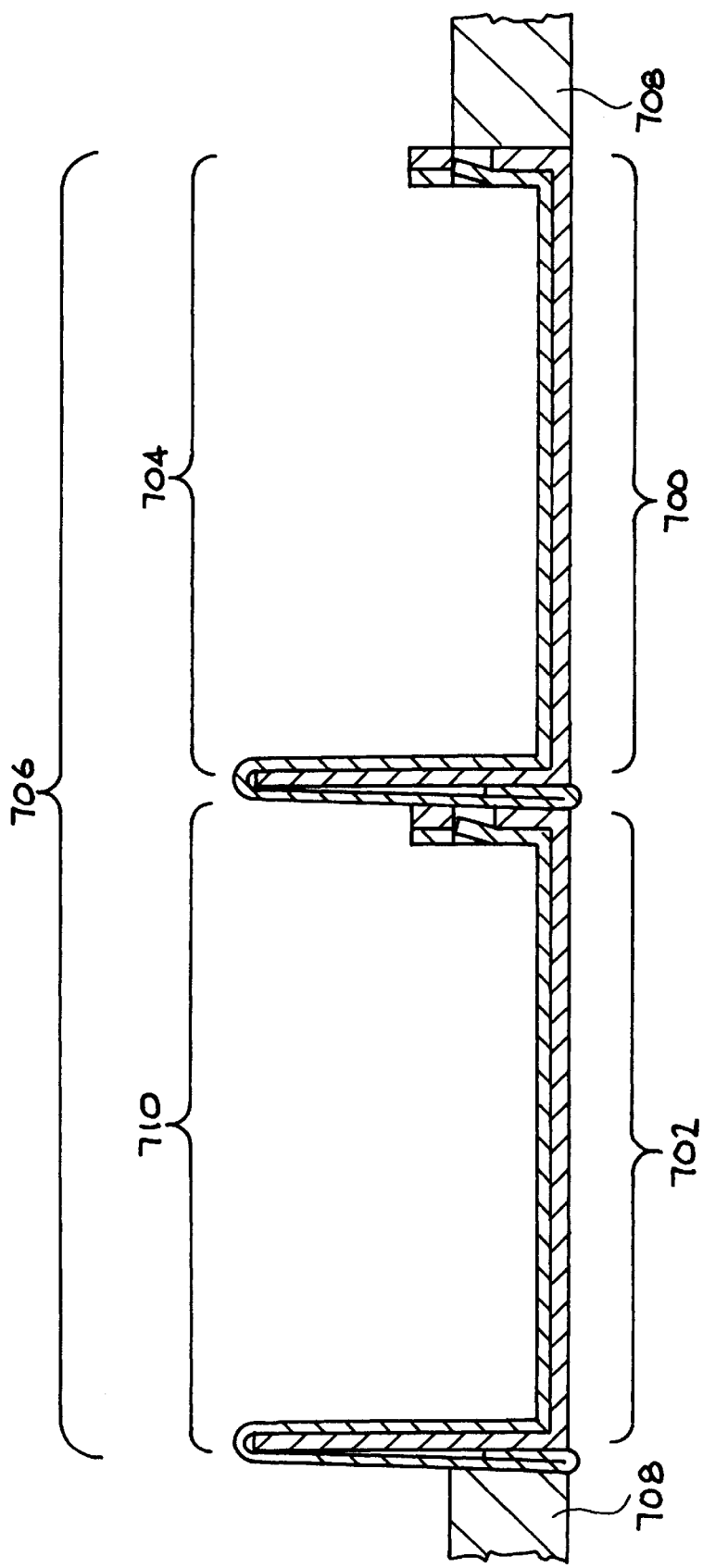
FIG. 8 is a top view of a pair of bulk head gasket assemblies according to the present invention fully installed parallel and adjacent to each other in a port in a shielding enclosure.

With reference to FIG. 8, a diagram is shown of gasket assemblies 700 and 702 each fully inserted into first and second slot areas 704 and 710 of port 706 in shielding enclosure 708.

The preferred embodiment of the present invention, a BGA, is thus described. While the present invention has been described in particular embodiments, it should be appreciated that the present invention should not be construed as limited by such embodiments, but rather construed according to the below claims.

What is claimed is:

1. An EMI bulk head gasket assembly comprising:
    a bulk head having a bulk head base plate and first and second bulk head side walls such that a bulk head recess is formed;
    a gasket including a gasket base plate and first and second gasket side walls, said gasket adapted to snap fit into said bulk head recess, such that said gasket lines the interior surface of said bulk head base plate, and said first and said second bulk head side walls;

a spring finger extending outward from a distal edge of said second gasket side wall, said spring finger having smooth edges such that said spring fingers does not pose a safety hazard to a user of said bulk head gasket assembly, said spring finger being buttressed by said second bulk head side wall which slips between said second gasket side wall and said spring finger such that said spring finger is prevented from being permanently deformed.

2. The bulk head gasket assembly of claim 1 further comprising:

an aperture in said first bulk head side wall;

a tab extending outward from said first gasket side wall, said tab positioned and adapted to snap fit into said aperture in said first bulk head side wall to retain said gasket in said bulk head recess when said gasket is snap fit into said bulk head recess.

3. The bulk head gasket assembly of claim 1 further comprising a through hole in said gasket base plate disposed to line up with a through hole in said bulk head base plate when said gasket is snap fit into said bulk head recess, said through hole in said gasket base plate and said through hole in said bulk head base plate providing access to the interior of a shielding enclosure when said bulk head gasket assembly is disposed over a port in said shielding enclosure.

4. The bulk head gasket assembly of claim 1 adapted for providing EMI shielding at an interface between a printed circuit board and a card drive port in a panel of a computer chassis.

5. The bulk head gasket assembly of claim 1 wherein said first gasket side wall forms an angle slightly greater than ninety degrees with said gasket base plate such that said first gasket side wall is spring loaded against said first bulk head side wall when said gasket is inserted into said bulk head recess.

6. The bulk head gasket assembly of claim 1 wherein said smooth edges of said spring finger are formed by an inner fold over bend at said distal edge of said spring finger.

7. A bulk head gasket assembly comprising:

a bulk head including a bulk head base plate and first and second bulk head side walls, said first and second bulk head side walls positioned at right angles to said bulk head base plate such that a bulk head recess is formed;

a gasket, adapted to snap fit into said bulk head recess, such that said gasket lines the interior surface of said bulk head base plate, and said first and said second bulk head side walls, said gasket further comprising;

a gasket base plate and first and second gasket side walls extending from said gasket base plate, a spring finger integral with said second gasket side wall and extending outward from a distal edge of said second gasket side wall wherein said spring finger includes a spring bend between a proximal spring finger section and a distal spring finger section, said spring finger being buttressed by said second bulk head side wall which slips between said second gasket side wall and said spring finger so that said spring finger is prevented from being bent inward to a state of perpetual deformity.

8. The bulk head gasket assembly of claim 7 further comprising:

an aperture in said first bulk head side wall;

a tab extending outward from said first gasket side wall, said tab positioned and adapted to snap fit into said aperture in said first bulk head side wall to retain said gasket in said bulk head recess when said gasket is snap fit into said bulk head.

9. The bulk head gasket assembly of claim 7 further comprising a through hole in said gasket base plate disposed to line up with a through hole in said bulk head base plate when said gasket is snap fit into said bulk head recess, said through hole in said gasket base plate and said through hole in said bulk head base plate providing access to the interior of a shielding enclosure when said bulk head gasket assembly is disposed over a port in said shielding enclosure.

10. The bulk head gasket assembly of claim 7 wherein said distal spring finger section includes an inner fold over bend at said distal edge of said distal spring finger section.

11. The bulk head gasket assembly of claim 7 adapted for providing EMI shielding at an interface between a printed circuit board and a card drive port in a panel of a computer chassis.

12. The bulk head gasket assembly of claim 7 wherein said first gasket side wall forms an angle slightly greater than ninety degrees with said gasket base plate such that said first gasket side wall is spring loaded against said first bulk head side wall when said gasket is inserted into said bulk head recess.

13. A bulk head gasket assembly for providing EMI shielding at a port in a panel of a shielding enclosure, said bulk head gasket assembly comprising:

a bulk head including a bulk head base plate and first and second bulk head side walls, said first and second bulk head side walls positioned at right angles to said bulk head base plate such that a bulk head recess is formed, said first bulk head side wall having a bulk head aperture formed there through;

a gasket, adapted to snap fit into said bulk head recess, such that said gasket lines the interior surface of said bulk head base plate, and said first and said second bulk head side walls, said gasket further comprising;

a gasket base plate and first and second gasket side walls extending from said gasket base plate, said first gasket side wall forming an angle slightly greater than ninety degrees with said gasket base plate such that said first gasket side wall is spring loaded against said first bulk head side wall when said gasket is inserted into said bulk head recess, a tab extending outward from said first gasket side wall, said tab positioned and adapted to snap fit into said bulk head aperture to retain said gasket in said bulk head recess, a spring finger integral with said second gasket side wall and extending outward from a distal edge of said second gasket side wall, said spring finger including a spring bend between a proximal spring finger section and a distal spring finger section wherein said distal spring finger section includes an inner fold over bend at said distal edge of said distal spring finger section, said spring finger being buttressed by said second bulk head side wall which slips between said second gasket side wall and said spring finger so that said spring finger is prevented from being bent inward to a state of perpetual deformity; and a through hole in said gasket base plate disposed to line up with a through hole in said bulk head base plate when said gasket is snap fit into said bulk head recess, said through hole providing access to the interior of a shielding enclosure when said bulk head gasket assembly is disposed over a port in said shielding enclosure.

* * * * *